US012566211B2

(12) United States Patent
Samit et al.

(10) Patent No.: US 12,566,211 B2
(45) Date of Patent: Mar. 3, 2026

(54) PEAK POWER PACKAGE TRACKING

(71) Applicants:Advanced Micro Devices, Inc., Santa Clara, CA (US); ATI Technologies ULC, Markham (CA)

(72) Inventors: Amanullah Samit, Markham (CA); Raman Madras Srinivasan, Austin, TX (US); Aniruddha Dasgupta, Round Rock, TX (US)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 131 days.

(21) Appl. No.: 18/050,742

(22) Filed: Oct. 28, 2022

(65) Prior Publication Data

US 2024/0142515 A1 May 2, 2024

(51) Int. Cl.
*G06F 1/00* (2006.01)
*G01R 31/28* (2006.01)
(52) U.S. Cl.
CPC ....... *G01R 31/2896* (2013.01); *G01R 31/287* (2013.01); *G01R 31/2879* (2013.01)
(58) Field of Classification Search
CPC .............. G01R 31/2896; G01R 31/287; G01R 31/2879; G06F 1/3203; Y02D 10/00
See application file for complete search history.

(56) References Cited

U.S. PATENT DOCUMENTS

| | | | | |
|---|---|---|---|---|
| 6,320,822 B1 * | 11/2001 | Okeya | ................... | G04G 19/12 |
| | | | | 307/130 |
| 7,337,339 B1 * | 2/2008 | Choquette | ............. | G06F 1/3287 |
| | | | | 713/320 |
| 8,862,909 B2 | 10/2014 | Branover et al. | | |
| 8,924,758 B2 | 12/2014 | Steinman et al. | | |
| 9,983,652 B2 | 5/2018 | Piga et al. | | |
| 10,671,148 B2 | 6/2020 | Tsien et al. | | |
| 11,054,887 B2 | 7/2021 | Tsien et al. | | |
| 2004/0268278 A1 * | 12/2004 | Hoberman | ................ | H02J 4/00 |
| | | | | 716/127 |
| 2006/0282685 A1 * | 12/2006 | Bahali | ................... | G06F 1/3203 |
| | | | | 713/300 |

(Continued)

*Primary Examiner* — Xuxing Chen
(74) *Attorney, Agent, or Firm* — Kowert, Hood, Munyon, 1Rankin & Goetzel, P.C.; Rory D. Rankin

(57) ABSTRACT

An apparatus and method for efficiently managing power consumption of multiple partitions of an integrated circuit. A processing unit includes multiple partitions, each assigned to operation parameters of a respective power domain. Each of the partitions is assigned to operating parameters of a respective power domain. A power manager accesses a total power consumption budget for the multiple partitions and sends corresponding assigned power limits to the multiple partitions. A particular partition calculates a corresponding measurement of power consumption as a weighted sum of sampled signals, and performs steps to reduce power consumption when the particular partition determines the corresponding measurement of power consumption exceeds a corresponding assigned power limit. The power manager updates the assigned power limits within a first time interval. The multiple partitions calculate the power consumption measurements and perform power reduction steps within a second time interval less than the first time interval.

20 Claims, 7 Drawing Sheets

(56)         References Cited

U.S. PATENT DOCUMENTS

| 2013/0173946 | A1* | 7/2013 | Rotem | .................. | G06F 1/3206 |
| | | | | | 713/340 |
| 2017/0185134 | A1* | 6/2017 | Han | .......................... | G06F 1/26 |
| 2021/0018971 | A1* | 1/2021 | Rotem | .................... | G06F 1/263 |
| 2022/0291734 | A1* | 9/2022 | Wilde | .................. | G06F 1/3203 |
| 2023/0019271 | A1* | 1/2023 | Mukherjee | ............. | G06F 1/329 |
| 2023/0205304 | A1* | 6/2023 | Man | ...................... | G06F 1/3206 |
| | | | | | 713/320 |
| 2023/0239809 | A1* | 7/2023 | Mukherjee | ........ | H04W 72/0473 |
| | | | | | 455/142 |

* cited by examiner

*Apparatus*
*100*
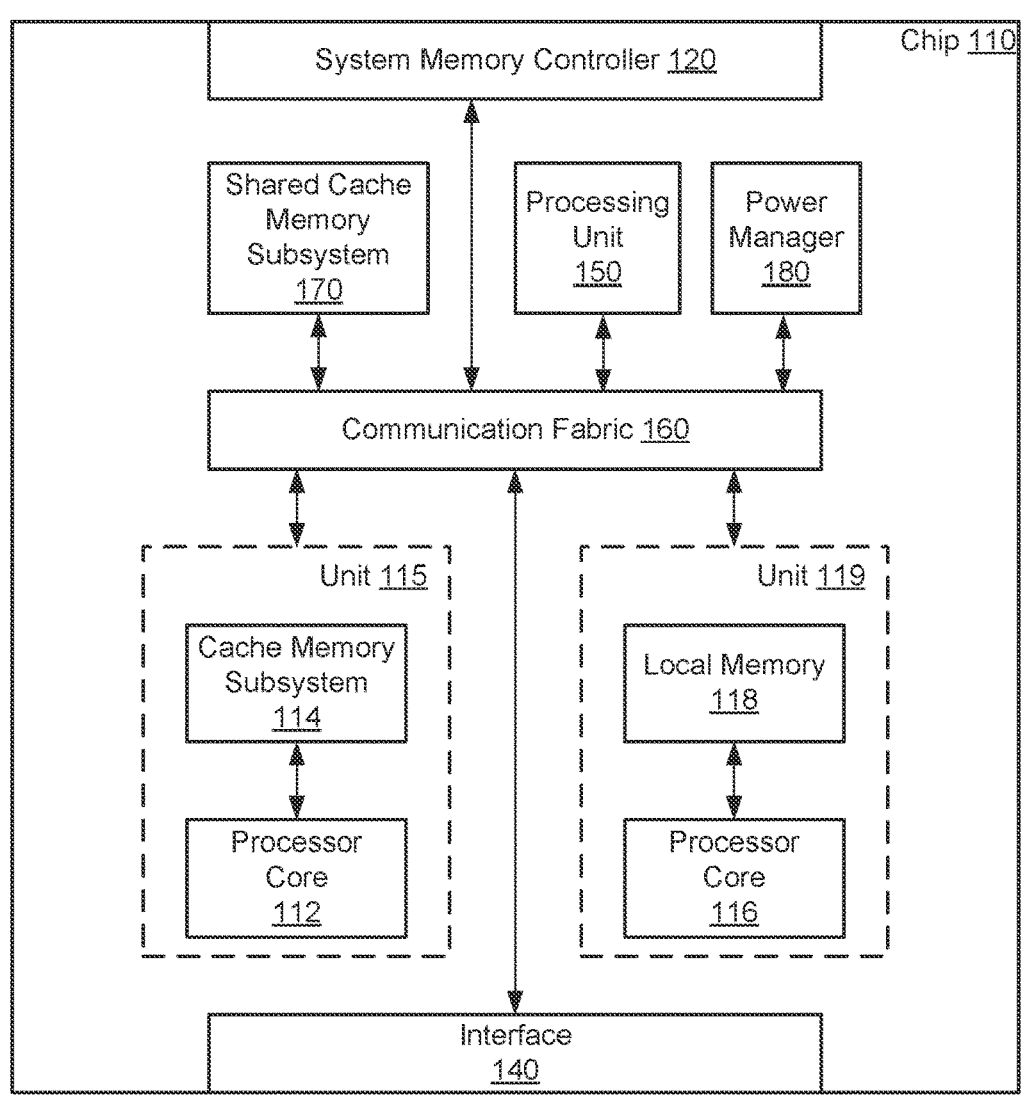
*FIG. 1*

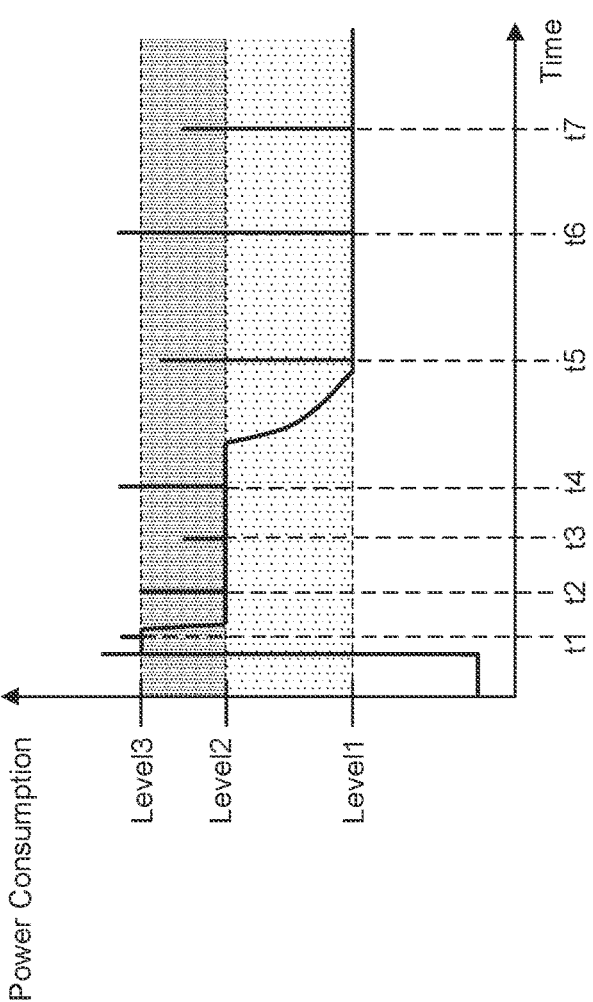
*FIG. 3*

*Method*
*500*

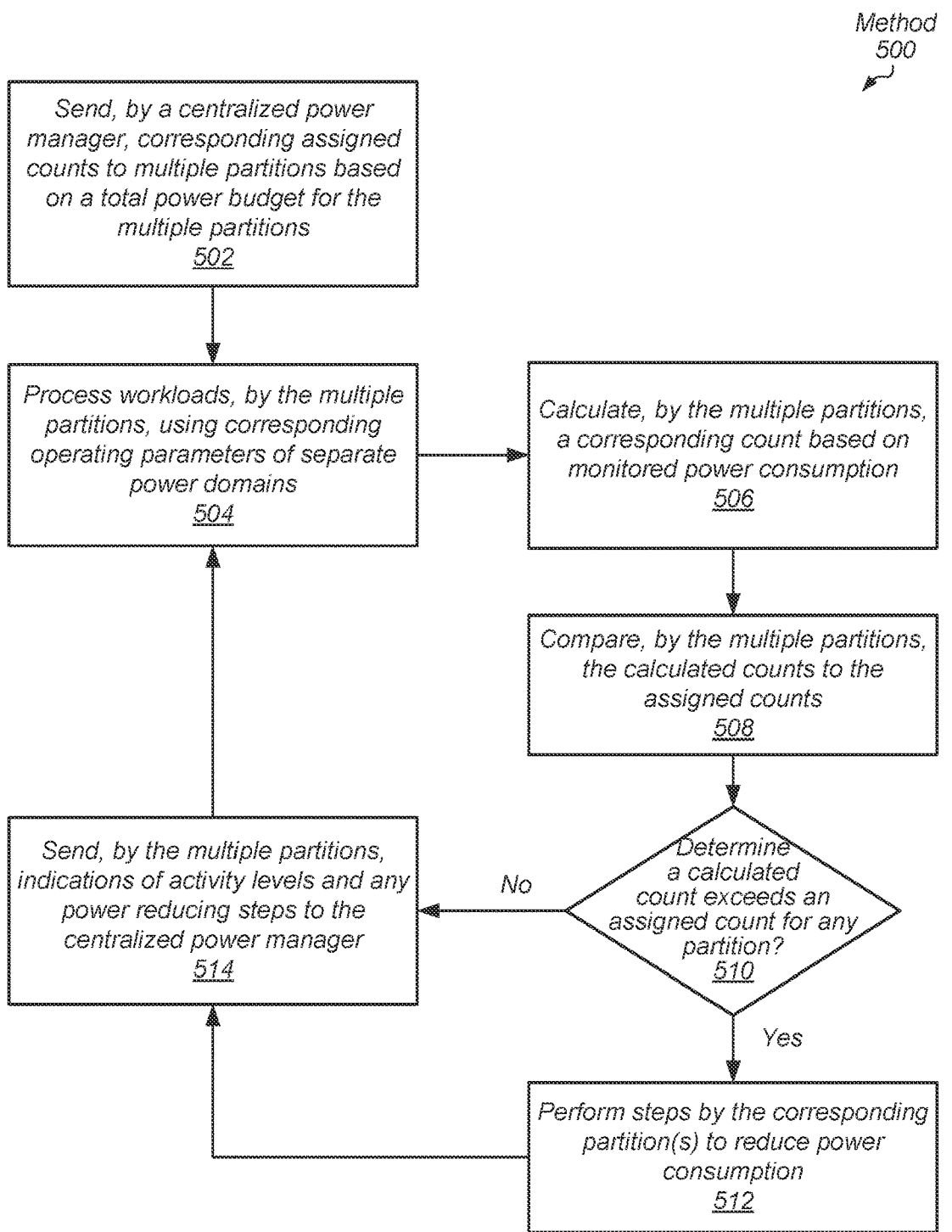

Send, by a centralized power manager, corresponding assigned counts to multiple partitions based on a total power budget for the multiple partitions
502

Process workloads, by the multiple partitions, using corresponding operating parameters of separate power domains
504

Calculate, by the multiple partitions, a corresponding count based on monitored power consumption
506

Compare, by the multiple partitions, the calculated counts to the assigned counts
508

Determine a calculated count exceeds an assigned count for any partition?
510

No

Send, by the multiple partitions, indications of activity levels and any power reducing steps to the centralized power manager
514

Yes

Perform steps by the corresponding partition(s) to reduce power consumption
512

*FIG. 5*

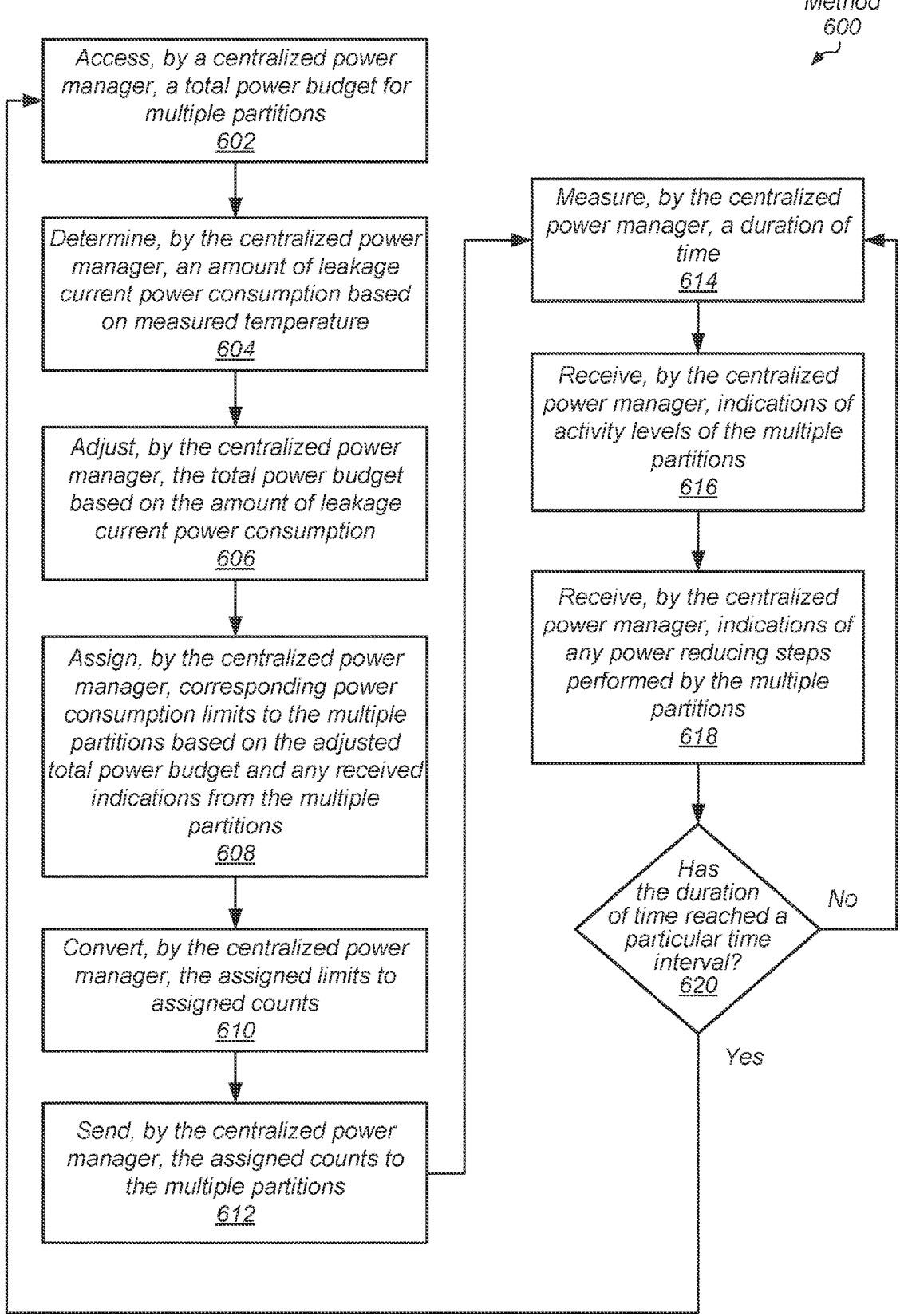

*Method*
*600*

Access, by a centralized power manager, a total power budget for multiple partitions
602

Determine, by the centralized power manager, an amount of leakage current power consumption based on measured temperature
604

Adjust, by the centralized power manager, the total power budget based on the amount of leakage current power consumption
606

Assign, by the centralized power manager, corresponding power consumption limits to the multiple partitions based on the adjusted total power budget and any received indications from the multiple partitions
608

Convert, by the centralized power manager, the assigned limits to assigned counts
610

Send, by the centralized power manager, the assigned counts to the multiple partitions
612

Measure, by the centralized power manager, a duration of time
614

Receive, by the centralized power manager, indications of activity levels of the multiple partitions
616

Receive, by the centralized power manager, indications of any power reducing steps performed by the multiple partitions
618

Has the duration of time reached a particular time interval?
620

No

Yes

*FIG. 6*

*Computing System*
*700*

PEAK POWER PACKAGE TRACKING

BACKGROUND

Description of the Relevant Art

Both planar transistors (devices) and non-planar transistors are fabricated for use in integrated circuits within semiconductor chips. A variety of choices exist for placing processing circuitry in system packaging to integrate multiple types of integrated circuits. Some examples are a system-on-a-chip (SOC), multi-chip modules (MCMs) and a system-in-package (SiP). Mobile devices, desktop systems, and servers use these packages. Regardless of the choice for system packaging, in several uses, power consumption of modern integrated circuits has become an increasing design issue with each generation of semiconductor chips.

As power consumption increases, more costly cooling systems such as larger fans and heat sinks are utilized to remove excess heat and prevent failure of the integrated circuit. However, cooling systems increase system costs. The power dissipation constraint of the integrated circuit is not only an issue for portable computers and mobile communication devices, but also for high-performance desktop computers and server computers. For example, cooling server racks in a datacenter includes complex solutions and advanced cooling technology. In addition, an air conditioner can be adjusted for a data center to run at less than full capacity all day each day based on a predetermined schedule. However, the actual power consumption of the servers can differ from this predetermined schedule.

An external agent can receive reported power consumption values of multiple integrated circuits of a semiconductor chip, and adjust operating parameters of one or more of the multiple integrated circuits. However, there is a time delay between a compute-related boost in power consumption and a temperature increase. There is also a further delay in the response time of the external agent. Therefore, one or more integrated circuits of the semiconductor chip can exceed an assigned power consumption limit for an appreciable amount of time.

In view of the above, methods and mechanisms for efficiently managing power consumption of multiple partitions of an integrated circuit are desired.

BRIEF DESCRIPTION OF THE DRAWINGS

FIG. 1 is a generalized block diagram an apparatus that efficiently managing power consumption of multiple partitions of an integrated circuit.

FIG. 3 is a generalized block diagram of a power waveform of a partition of multiple partitions processing a workload.

FIG. 5 is a generalized block diagram of a method for efficiently managing power consumption of multiple partitions of an integrated circuit.

FIG. 6 is a generalized block diagram of a method for efficiently managing power consumption of multiple partitions of an integrated circuit.

Figure 2:
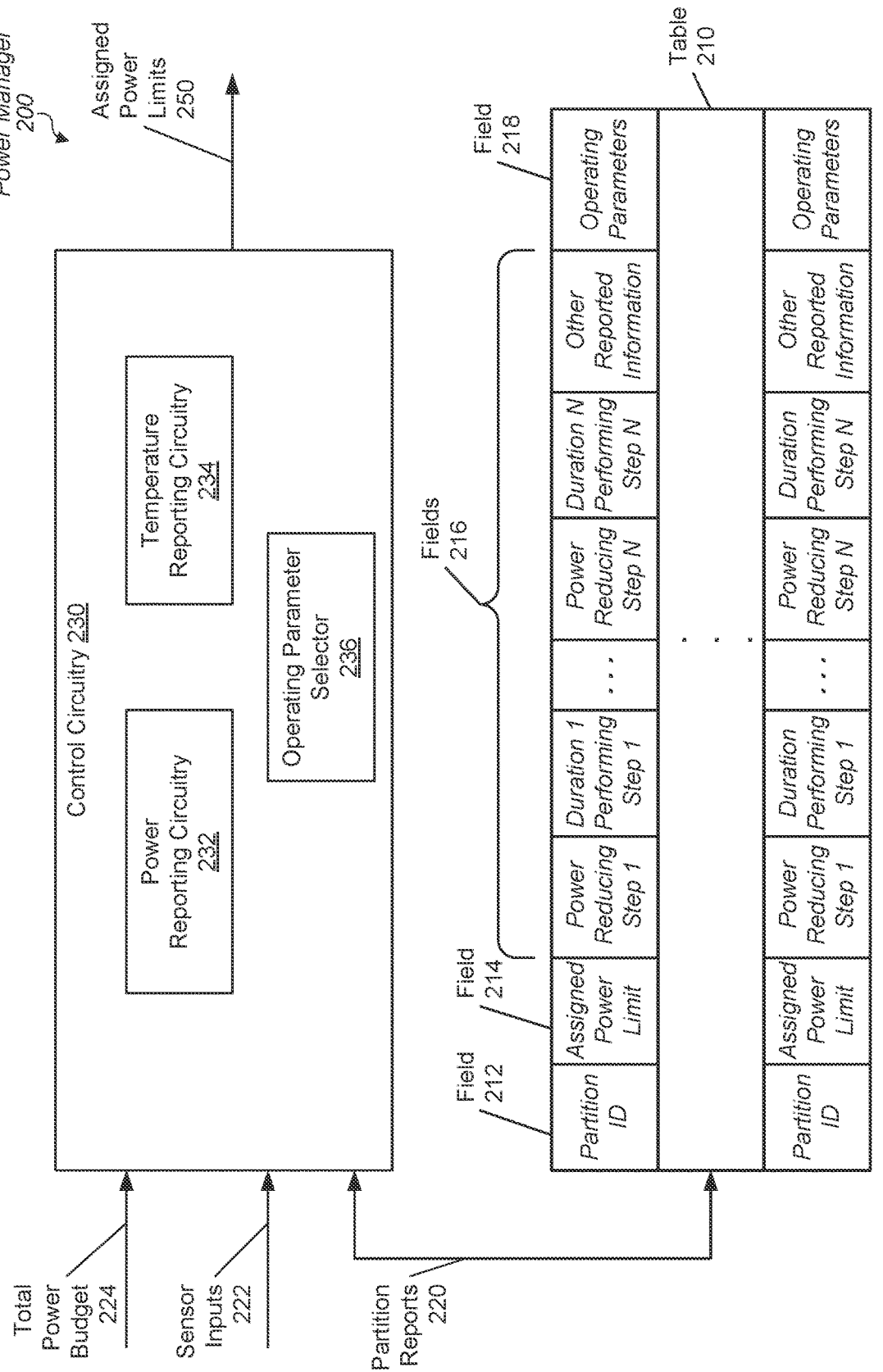
FIG. 2 is a generalized block diagram of a power manager that manages power consumption of multiple partitions of an integrated circuit.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods efficiently managing power consumption of multiple partitions of an integrated circuit are contemplated. In various implementations, a semiconductor chip includes multiple partitions with each partition including circuitry that is capable of executing instructions of one or more applications of a workload. Each of the partitions is assigned to operating parameters of a respective power domain. Each of the power domains includes operating parameters such as at least an operating power supply voltage and an operating clock frequency. Each of the power domains also includes control signals for enabling and disabling connections to clock generating circuitry and a power supply reference. Therefore, at least two partitions do not share the same connections to the same clock generating circuitry and the power supply reference.

Each partition, which includes circuitry separate from another partition, includes one or more of processor cores (or cores) of a general-purpose central processing unit (CPU), a digital signal processor (DSP), a display controller, a variety of application specific integrated circuits (ASICs), a multimedia engine, a graphics processing unit (GPU), a system memory controller, one or more input/output (I/O) interface units, a communication fabric, and so forth. In some implementations, the semiconductor chip includes a power manager such as an on-die microcontroller, a dedicated processor core of multiple available cores, a dedicated ASIC, or other. The power manager receives an indication of a total power consumption budget for the multiple partitions from an external agent or by reading a particular configuration register.

In some implementations, the power manager also receives sensor inputs, which represent measured temperature values from analog or digital thermal sensors placed throughout the die. In an implementation, the power manager determines an amount of transistor leakage current power consumption based on the received measured temperature values. The power manager reduces the total power consumption budget by the amount of transistor leakage current power consumption. Afterward, the power manager determines a corresponding assigned power limit for each of the multiple partitions based on the adjusted (reduced) total power consumption budget.

One or more of the power manager, the multiple partitions, or another processing unit determines operating parameters of a corresponding power domain for use by the multiple partitions. While processing a workload using the assigned operating parameters, at least a particular partition of the partitions calculates a corresponding measurement of power consumption as a weighted sum of sampled signals that toggle during processing of the workload. The particular partition compares the calculated measurement of power consumption to the assigned power limit from the power manager. If the particular partition determines that calculated measurement of power consumption exceeds the assigned power limit, then the particular partition performs steps to reduce power consumption.

In some implementations, the power manager is capable of updating the multiple assigned power limits for the multiple partitions within a first time interval, and the multiple partitions are capable of calculating the power consumption measurement and determining to perform the power reduction steps within a second time interval less than the first time interval. In an implementation, the first time interval is approximately a millisecond, and the second time interval is in the range of nanoseconds or microseconds. Therefore, the second time interval can be significantly less than the first time interval.

In some implementations, the particular partition reduces power consumption by inserting stalls in an instruction execution pipeline. In another implementation, the particular partition reduces power consumption by dividing its assigned operating clock frequency. The particular partition reports to the power manager one or more of the steps to reduce power consumption, an amount of time spent performing the steps to reduce power consumption, an indication of an activity level, and one or more calculated values of the power consumption measurement or an average of the calculated values of the power consumption measurement. When the first time interval elapses, the power manager determines whether the total power budget had changed, and the power manager determines updated corresponding assigned power limits for the multiple partitions based on the total power budget and reported information from the multiple partitions. Further details of efficiently managing balanced performance among replicated partitions of an integrated circuit despite loss of functionality due to manufacturing defects are provided in the following discussion.

Referring to FIG. 1, a generalized block diagram is shown of an apparatus 100 that efficiently managing power consumption of multiple partitions of an integrated circuit. The apparatus 100 includes the semiconductor chip 110, which can be connected system memory, one or more input/output (I/O) devices, and so forth. The semiconductor chip 110 (or chip 110) includes multiple types of integrated circuits. For example, the chip 110 includes the system memory controller 120 to communicate with a system memory (not shown for ease of illustration), the interface 140, the processing units (units) 115 and 119, communication fabric 160, a shared cache memory subsystem 170, the processing unit 150, and the power manager 180. Clock sources, such as phase lock loops (PLLs), interrupt controllers, power controllers, interfaces for input/output (I/O) devices, and so forth are not shown in FIG. 1 for ease of illustration.

A variety of choices exist for placing the circuitry of chip 110 in system packaging to integrate the multiple types of integrated circuits. Some examples are a system-on-a-chip (SOC), multi-chip modules (MCMs), and a system-in-package (SiP). In various implementations, the units 115, 119 and 150 are multiple clients in the chip 110. As used herein, a "client" refers to an integrated circuit with data processing circuitry and local memory, which has tasks assigned to it by a scheduler such as an operating system scheduler or other. Examples of clients are a general-purpose central processing unit (CPU), a parallel data processing engine with a relatively wide single-instruction-multiple-data (SIMD) micro-architecture, a multimedia engine, a display controller, one of a variety of types of an application specific integrated circuit (ASIC), a digital signal processor (DSP), a field programmable gate array (FPGA), and so forth.

The processing unit 115 includes the core 112 and corresponding cache memory subsystems 114. The processing unit 119 includes the core 116 and corresponding local memory 118. Although a single core is shown in each of the units 115 and 119, in other implementations, another number of cores are used. It is noted that various portions of an operating system can be resident in the external system memory, in the caches 114, stored on a non-volatile storage device such as a hard disk (not shown), and so on. In an implementation, the illustrated functionality of chip 110 is incorporated upon a single integrated circuit.

Although three clients (units 115, 119 and 150) are shown, it is possible and contemplated that the chip 110 includes another number of clients. In various implementations, the core 112 and 116 are capable of executing one or more threads and share at least the shared cache memory subsystem 170, the processing unit 150, and coupled input/output (I/O) devices connected to the circuitry of the interface 140. In some implementations, the units 115, 119 and 150 use different microarchitectures.

In various implementations, the chip 110 includes multiple partitions with each partition including circuitry that is capable of executing instructions of one or more applications of a workload. Partitions are not shown for ease of illustration. In addition, a variety of choices for including particular components of chip 110 in a particular partition are possible and contemplated. In an implementation, the shared cache memory subsystem 170 and the unit 115 are placed in a first partition, the unit 119 is placed in a second partition, the communication fabric 160 and the interface 140 are placed in a third partition, the processing unit 150 and the system memory controller 120 are placed in a fourth partition, and the remainder of the chip 110 is placed in a fifth partition. Other placements of the components of the chip 110 in multiple partitions are used based on design requirements.

Each of the partitions is assigned to operating parameters of a respective power domain. Each of the power domains includes operating parameters such as at least an operating power supply voltage and an operating clock frequency. Each of the power domains also includes control signals for enabling and disabling connections to clock generating circuitry and a power supply reference. Therefore, at least two partitions do not share the same connections to the same clock generating circuitry and the power supply reference. The power manager 180 is an on-die microcontroller, a dedicated processor core of multiple available cores, a dedicated ASIC, or other. In some implementations, the power manager 180 accesses an indication of a total power consumption budget for the multiple partitions from an external agent or by reading a particular configuration register.

In an implementation, the power manager 180 also receives sensor inputs, which represent measured temperature values from analog or digital thermal sensors placed throughout the die of the chip 110. In an implementation, the power manager 180 determines an amount of transistor leakage current power consumption based on one or more of the received measured temperature values and calculated temperature values. Using the total power consumption budget determined from the external agent or the particular configuration register, the power manager 180 reduces this total power consumption budget by the amount of transistor leakage current power consumption. This reduced value is the adjusted power consumption budget.

Afterward, the power manager 180 determines a corresponding assigned power limit for each of the multiple partitions based on the adjusted power consumption budget. In some implementations, the total power consumption budget is a value represented in units of watts, and the power manager 180 converts this value to a count value (or count) representative of a weighted sum of sampled signals that toggle during processing of the workload. Therefore, the assigned power limits are also values representative of the weighted sum, rather than values represented in units of watts. In other implementations, the power manager 180 convers the total power consumption budget to a number of credits, and the assigned power limits are also values representative of a number of credits. Other values representing the total power consumption budget and the assigned power limits are also possible and contemplated. In yet another implementation, the power manager 180, in addition to sending the separate power limits, sends to one or more partitions an indication of a limit on one or more of an operating power supply voltage and an operating clock frequency.

The power manager 180 sends the corresponding assigned power limits to the multiple partitions. While processing a workload using the assigned operating parameters, at least a particular partition of the multiple partitions calculates a corresponding measurement of power consumption as a weighted sum of sampled signals that toggle during processing of the workload. Examples of the sampled signals are clock enable signals, bus driver enable signals, lines that indicate mismatches in content-addressable memories (CAM), and word-line (WL) drivers for CAMs and synchronous random access memories (SRAMs). The particular partition compares the calculated measurement of power consumption to the assigned power limit from the power manager. If the particular partition determines that calculated measurement of power consumption exceeds the assigned power limit, then the particular partition performs steps to reduce power consumption.

In some implementations, the power manager 180 is capable of updating the multiple assigned power limits for the multiple partitions within a first time interval, and the multiple partitions are capable of calculating the power consumption measurement and determining to perform the power reduction steps within a second time interval less than the first time interval. In an implementation, the first time interval is approximately a millisecond, and the second time interval is in the range of nanoseconds or microseconds. Therefore, the second time interval can be significantly less than the first time interval. The particular partition reports to the power manager one or more of the steps to reduce power consumption, an amount of time spent performing the steps to reduce power consumption, an indication of an activity level, and one or more calculated values of the power consumption measurement or an average of the calculated values of the power consumption measurement.

When the first time interval elapses, the power manager 180 determines whether the total power budget had changed, and the power manager 180 determines updated corresponding assigned power limits for the multiple partitions based on the total power budget and reported information from the multiple partitions. Before continuing with further details of efficiently managing power consumption of multiple partitions of an integrated circuit, a further description of the components of the apparatus 100 is provided.

Interface 140 generally provides an interface for a variety of types of input/output (I/O) devices off the chip 110 to the shared cache memory subsystem 170 and processing units 115. Generally, the circuitry of the interface 140 includes buffers for receiving packets from a corresponding link and for buffering packets to be transmitted upon a corresponding link. Any suitable flow control mechanism can be used for transmitting packets to and from the chip 110. The system memory connected to the system memory controller 120 can be used as system memory for the chip 110, and include any suitable memory devices such as one or more RAMBUS dynamic random access memories (DRAMs), synchronous DRAMs (SDRAMs), DRAM, static RAM, etc.

The address space of the chip 110 is divided among multiple memories corresponding to the multiple cores. In an implementation, the coherency point for an address is the system memory controller 120, which communicates with the memory storing bytes corresponding to the address. The system memory controller 120 includes control circuitry for interfacing to memories and request queues for queuing memory requests. Generally speaking, the communication fabric 160 responds to control packets received on the links of the interface 140, generates control packets in response to cores 112 and 116 and/or cache memory subsystems 114 and 118, generates probe commands and response packets in response to transactions selected by the system memory controller 120 for service, and to route packets to other nodes through the interface 140. The communication fabric supports a variety of packet transmitting protocols and includes one or more of system buses, packet processing circuitry and packet selection arbitration logic, and queues for storing requests, responses and messages.

Cache memory subsystem 114 includes relatively high-speed cache memories that store blocks of data. Cache memory subsystem 114 can be integrated within respective the high-performance core 112. Alternatively, cache memory subsystem 114 is connected to the high-performance core 112 in a backside cache configuration or an inline configuration, as desired. The cache memory subsystem 114 can be implemented as a hierarchy of caches. In an implementation, cache memory subsystems 114 represents a L2 cache structures, and shared cache memory subsystem 170 represents an L3 cache structure. The local memory 118 can be implemented in any of the above manners described for the cache memory subsystem 114, as a local data store, or other.

Turning now to FIG. 2, a generalized block diagram is shown of a power manager 200 that manages power consumption of multiple partitions of an integrated circuit. As shown, the power manager 200 includes the table 210 and the control circuitry 230. The control circuitry 230 includes hardware, such as circuitry, of the multiple components 232-236 that are used to generate the operating parameters 250 of multiple power domains, which are sent to multiple partitions. The control circuitry 230 receives the partition reports 220 from the table 210, sensor inputs 222, and a total power consumption budget (or total power budget 224), which are used to generate the assigned power limits 250 for multiple partitions. The table 210 includes multiple table entries (or entries), each storing information in multiple fields such as at least fields 212-218.

The table 210 is implemented with one of flip-flop circuits, a random access memory (RAM), a content addressable memory (CAM), or other. Although particular information is shown as being stored in the fields 212-218 and in a particular contiguous order, in other implementations, a different order is used and a different number and type of information is stored. As shown, field 212 stores a partition identifier (ID) that specifies a particular partition of multiple partitions used in an integrated circuit. In various implementations, a semiconductor chip includes multiple partitions with each partition including circuitry that is capable of executing instructions of one or more applications of a workload. Each of the partitions is assigned to operating parameters of a respective power domain. Each of the power domains includes operating parameters such as at least an operating power supply voltage and an operating clock frequency. Each of the power domains also includes control signals for enabling and disabling connections to clock generating circuitry and a power supply reference. Therefore, at least two partitions do not share the same connections to the same clock generating circuitry and the power supply reference. The circuitry of a particular partition is separate from circuitry of another partition. A partition includes one or more of processor cores (or cores) of a general-purpose central processing unit (CPU), a digital signal processor (DSP), a display controller, a variety of application specific integrated circuits (ASICs), a multimedia engine, a graphics processing unit (GPU), a system memory controller, one or more input/output (I/O) interface units, a communication fabric, and so forth.

The field 214 stores a currently assigned power limit for the identified partition. As described earlier, the assigned power limits are values represented in units of watts, values representative of a number of power credits, values represented in counts, and so forth. In other implementations, the field 214 also stores, in addition to the assigned power limit, an indication of a limit for a corresponding partition on one or more of an operating power supply voltage and an operating clock frequency. The fields 216 stores reported information from the corresponding partition identified in field 212. An example of this reported information are one or more indications of the steps to reduce power consumption such as the fields storing indications of power reducing step 1 to power reducing step N, where N is a positive, non-zero integer. In some implementations, a corresponding partition performs a power reducing step by inserting stalls in an instruction execution pipeline. In another implementation, the corresponding partition performs a power reducing step by dividing its assigned operating clock frequency.

Another example of the reported information in fields 216 are one or more indications of an amount of time that the corresponding partition spent performing the steps to reduce power consumption. For example, the fields 216 includes fields storing indications of a duration 1 performing the power reducing step 1 to duration N performing the power reducing step N. The durations of time are values representative of an absolute time, a percentage of a particular time interval, a count of a number of clock cycles, or other. In some implementations, the reported information in fields 216 also includes an indication of an activity level, and one or more calculated values of the power consumption measurement or an average of the calculated values of the power consumption measurement. The field 218 stores operating parameters currently used by the corresponding partition such as at least an operating power supply voltage and an operating clock frequency. When one or more of the operating power supply voltage and the operating clock frequency have been reduced by the corresponding partition, the values stored the field 218 are assigned values. The amount of reduction of these values is indicated in the reported information stored in fields 216.

The control circuitry 230 receives partition reports 220 from the multiple partitions such as the information stored in table 210. The control circuitry 230 also receives sensor inputs 222, which represent measured temperature values from analog or digital thermal sensors placed throughout the die. The control circuitry 230 is also able to update information stored in the table 210 such as at least the updated assigned power limits stored in field 214. The power reporting circuitry 232 calculates the assigned power limits 250 from the received information of the partition reports 220 and the sensor inputs 222. The power reporting circuitry 232 also calculates a leakage power value to consider for determining power values. The leakage power value is dependent on one or more of a calculated temperature and the sensor inputs 222.

In an implementation, the control circuitry 230 receives an indication of the total power consumption budget 224 for the multiple partitions from an external agent or by reading a particular configuration register. In some implementations, the power reporting circuitry 232 associates a total power consumption budget 224 for the multiple partitions to a thermal design power (TDP) value for the multiple partitions. In an implementation, the power reporting circuitry 232 converts the total power consumption budget 224 from a value represented in units of watts to a value represented as one of a count representing a weighted sum of sampled signals that toggle during processing of the workload, a number of power credits, or other. The power reporting circuitry 232 divides the total power consumption budget 224 among the multiple partitions identified by the identifiers stored in field 212 of table 210, and generates the assigned power limits 250. A sum of the assigned power limits 250 equals the total power consumption budget 224 for the multiple partitions. The power reporting circuitry 232 adjusts the assigned power limits 250 for each one of the multiple partitions over time.

In some implementations, the control circuitry 230 is capable of updating the multiple assigned power limits 250 for the multiple partitions within a first time interval, and the multiple partitions are capable of performing the power reduction steps within a second time interval less than the first time interval. In an implementation, the first time interval is approximately a millisecond, and the second time interval is in the range of nanoseconds or microseconds. Therefore, the second time interval can be significantly less than the first time interval. By the end of the first time interval, such as a millisecond in one implementation, one or more of the partitions have reported the information stored in fields 216 of table 210. For example, at least a particular partition has reported one or more of the steps to reduce power consumption, an amount of time spent performing the steps to reduce power consumption, an indication of an activity level, and one or more calculated values of the power consumption measurement or an average of the calculated values of the power consumption measurement. The particular partition can report that it spent one third of the first time interval, such as one third of the millisecond, dividing its assigned operating clock frequency from 2 gigahertz (GHz) to 1 GHz. Another partition can report that it spent one quarter of the first time interval dividing its operating clock frequency from 900 megahertz (MHz) to 600 megahertz (MHz) and spent another quarter of the first time interval inserting stall cycles into pipelines using the assigned operating clock frequency of 900 MHz.

When the first time interval elapses, such as when the millisecond elapses in one implementation, the power reporting circuitry 232 determines updated assigned power limits 250 for the multiple partitions based on the total power consumption budget 224 and the reported information from the multiple partitions stored in fields 216 of table 210. For example, the power reporting circuitry 232 determines whether to reduce the assigned power limit of the assigned power limits 250 for the particular partition that spent one third of the first time interval dividing its assigned operating clock frequency from 2 GHz to 1 GHz. Such a reduction of the assigned power limit can be more efficient than relying on the particular partition to divide its operating clock frequency while its operating power supply voltage remains the same in the next first interval (next millisecond in one implementation). The reduced assigned power limit can lead to reductions for the particular partition in both the operating power supply voltage and the operating clock frequency. Additionally, the reduced power limit allows one or more other partitions to be assigned higher power limits of the assigned power limits 250.

In some implementations, the assigned power limits 250 indicate a range for the power domains, which includes operating parameters such as the operating power supply voltage and the operating clock frequency. In addition to determining the assigned power limits 250 for the multiple partitions, in some implementations, the power reporting circuitry 232 also determines limits on one or more of the operating power supply voltage and the operating clock frequency of one or more partitions. In another implementation, the operating parameter selector 236 determines limits on one or more of the operating power supply voltage and the operating clock frequency of one or more partitions.

In an implementation, the calculated temperature is determined by the temperature reporting circuitry 234 and utilizes a worst-case ambient temperature value. In an implementation, when the sensor-measured temperature is significantly different from the calculated temperature, the calculated power value does not change. The operating parameter selector 236 receives temperature related values from the temperature reporting circuitry 234. The operating parameter selector 236 also receives a calculated power value. In an implementation, the operating parameter selector 236 also receives both the currently assigned power limits and updated assigned power limits for each partition from the power reporting circuitry 232. Based on these inputs, the operating parameter selector 236 generates updated limits on the operating parameters of the separate power domains for the multiple partitions.

The control circuitry 230 sends these updated limits on the operating parameters along with the assigned power limits 250 to the multiple partitions. Therefore, the power manager 200 is able to perform power consumption management for multiple partitions during a larger first interval, such as a millisecond, while an individual partition is able to perform power consumption management for itself during a smaller second time interval, such as a range of nanoseconds or microseconds. At the end of the first time interval, the power manager 200 updates the assigned power limits 250 based on information reported by the partitions (and stored in fields 216 of table 210) corresponding to reactive actions, if any, that occurred during the smaller second time interval.

Referring to FIG. 3, a generalized block diagram is shown of a power waveform 300 of a partition of multiple partitions processing a workload. As shown, the power waveform 300 for a particular partition of multiple partitions transitions between three assigned power limits indicated as "Level1," "Level2," and "Level3." However, the power consumption of the partition also exceeds each of these assigned power levels for a relatively short duration of time. During point in time (or time) t1, the power consumption of the partition exceeds Level 3. During times t2, t3, and t4, the power consumption of the partition exceeds Level 2. During times t5, t6, and t7, the power consumption of the partition exceeds Level 1. In some implementations, the power manager is capable of updating the multiple assigned power limits for the partition within a first time interval. The transition from Level 3 to Level 2 occurs after one or more first time intervals, or after one or more milliseconds, in an implementation. Similarly, the transition from Level 2 to Level 1 occurs after one or more first time intervals, or after one or more milliseconds, in an implementation. The partition is capable of calculating a power consumption measurement and determining whether to perform power reduction steps within a second time interval less than the first time interval. In an implementation, the first time interval is approximately a millisecond, and the second time interval is in the range of nanoseconds or microseconds. Therefore, the second time interval can be significantly less than the first time interval. Accordingly, when the partition exceeds the assigned power level, the partition is able to recover and reduce its power consumption relatively quickly. As shown, the partition reduces the exceeding power consumption values at times t1 to t7.

Figure 4:
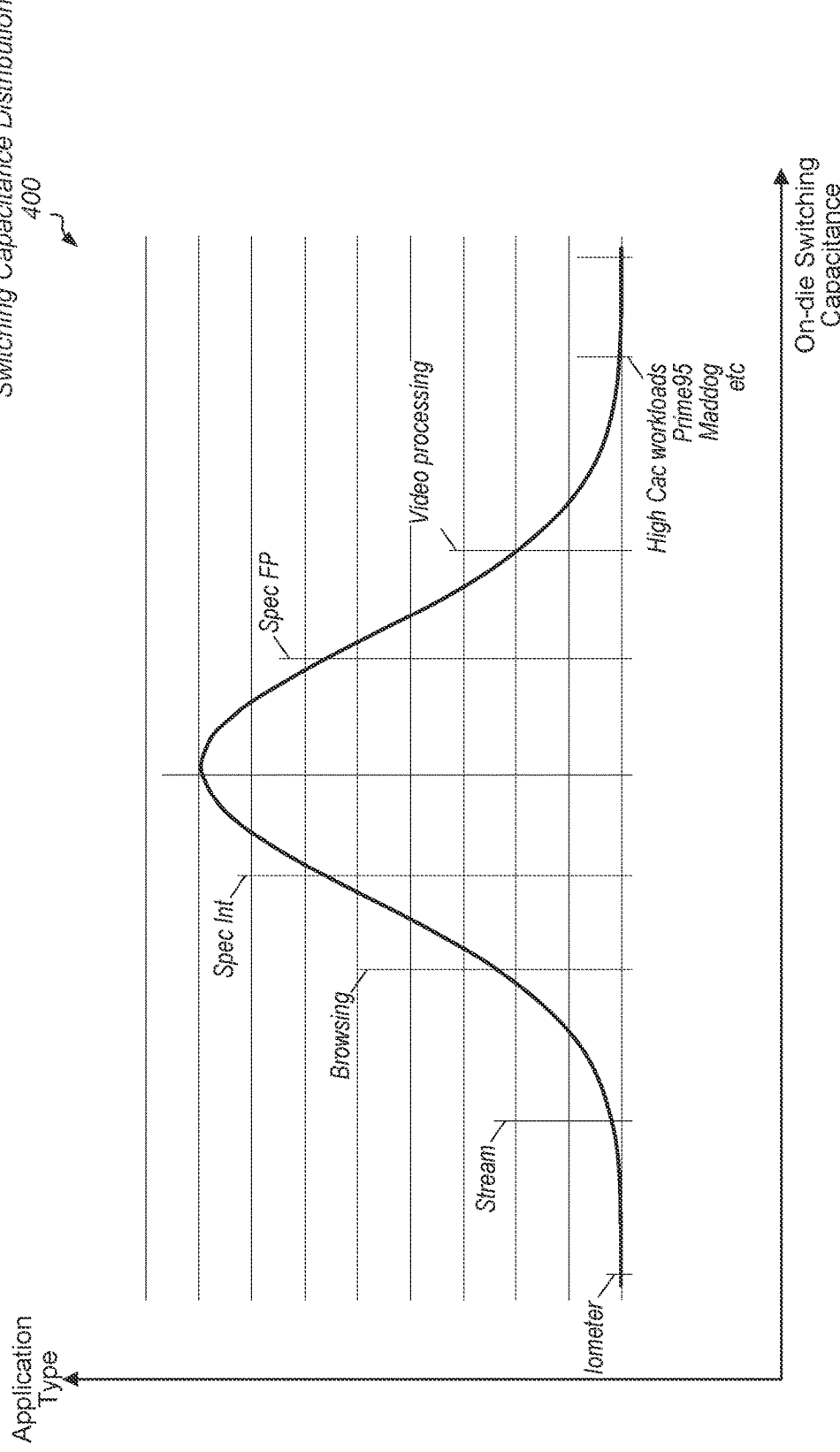
FIG. 4 is a generalized block diagram of switching capacitance distribution of different types of workloads.

Turning now to FIG. 4, a generalized block diagram is shown of switching capacitance distribution 400 of different types of workloads. The switching capacitance distribution 400 (or distribution 400) is shown for different types of applications. Although particular types of applications are shown, it is possible and contemplated that a variety of other applications cause a range of switching capacitance within a partition. Real-time power estimation can be achieved by a monitor measuring the switching capacitance on a die during a particular clock cycle. A node capacitance includes both the switched, or the alternating current (AC) capacitance, and the effective capacitance resulting from crossover current.

The selection of which signals to sample during a particular clock cycle corresponds to how well the selection correlates to the amount of switching node capacitance within the particular partition. For example, clock enable signals routed to local clock distribution blocks can be the signals chosen to be sampled and to provide reliable and accurate power usage values. There are other signals whose assertion indicates an amount of switched capacitance aside from the clock gater enable signals. Some examples are bus driver enable signals, lines that indicate mismatches in content-addressable memories (CAM), and word-line (WL) drivers for CAMs and synchronous random access memories (SRAMs).

Referring to FIG. 5, a generalized block diagram is shown of a method 500 for efficiently managing power consumption of multiple partitions of an integrated circuit. For purposes of discussion, the steps in this implementation (as well as in FIG. 6) are shown in sequential order. However, in other implementations some steps occur in a different order than shown, some steps are performed concurrently, some steps are combined with other steps, and some steps are absent.

A semiconductor chip includes multiple partitions, such as at least two partitions, each assigned to a respective power domain. Each of the power domains includes operating parameters such as at least an operating power supply voltage and an operating clock frequency. Each of the power domains also includes control signals for enabling and disabling connections to clock generating circuitry and a power supply reference. Therefore, the at least two partitions do not share the same connections to the same clock generating circuitry and the power supply reference. The partitions include circuitry that is capable of processing tasks of one or more applications of a workload. The semiconductor chip also includes a power manager such as an on-die microcontroller, a dedicated processor core of multiple available cores, a dedicated ASIC, or other. The power manager accesses an indication a total power consumption budget for the multiple partitions from an external agent or by reading a particular configuration register. The power manager determines a corresponding assigned power limit for each of the multiple partitions based on at least the total power consumption budget. The power manager sends the corresponding assigned power limits as corresponding assigned counts to multiple partitions based on a total power budget for the multiple partitions (block 502).

In some implementations, the total power consumption budget is a value represented in units of watts, and the power manager converts this value to a count value (or count) representative of a weighted sum of sampled signals that toggle during processing of the workload. Therefore, the assigned power limits are also values representative of the weight sum, rather than values represented in units of watts. One or more of the power manager, the multiple partitions, or the circuitry of another processing unit determines operating parameters of a corresponding power domain for use by the multiple partitions. The multiple partitions process workloads using corresponding operating parameters of separate power domains (block 504).

The multiple partitions calculate a corresponding count based on monitored power consumption (block 506). In some implementations, the multiple partitions calculate the counts as weighted sums of sampled signals that toggle during processing of the workload. Real-time power estimation can be achieved by a monitor measuring the switching capacitance on a die during a particular clock cycle. A node capacitance includes both the switched, or the alternating current (AC) capacitance, and the effective capacitance resulting from crossover current. By basing the power consumption value on sampled signals rather than temperature, the partition is able to determine power usage values independent of environment variations.

The selection of which signals to sample during a particular clock cycle corresponds to how well the selection correlates to the amount of switching node capacitance within the particular partition. For example, clock enable signals routed to local clock distribution blocks can be the signals chosen to be sampled and to provide reliable and accurate power usage values. There are other signals whose assertion indicates an amount of switched capacitance aside from the clock gater enable signals. Some examples are bus driver enable signals, lines that indicate mismatches in content-addressable memories (CAM), and word-line (WL) drivers for CAMs and synchronous random access memories (SRAMs).

The multiple partitions compare the calculated counts to the assigned counts (block 508). If any partitions determine that a calculated count exceeds an assigned count ("yes" branch of the conditional block 510), then the corresponding partitions perform steps by to reduce power consumption (block 512). In some implementations, a corresponding partition reduces power consumption by inserting stalls in an instruction execution pipeline. In another implementation, the corresponding partition reduces power consumption by dividing its assigned operating clock frequency. Afterward, the corresponding partitions send to the power manager one or more of indications of the steps to reduce power consumption, an amount of time spent performing the steps to reduce power consumption, an indication of an activity level, and one or more calculated values of the power consumption measurement or an average of the calculated values of the power consumption measurement (block 514).

If no partitions determine that a calculated count exceeds an assigned count ("no" branch of the conditional block 510), then control flow of method 500 moves to block 514 where the multiple partitions report information to the power manager. In some implementations, the multiple partitions report information to the power manager after a particular time interval if the calculated count does not exceed the assigned count during the particular time interval.

Turning now to FIG. 6, a generalized block diagram is shown of a method 600 for efficiently managing power consumption of multiple partitions of an integrated circuit. A centralized power manager (or power manager) accesses a total power budget for multiple partitions (block 602). The power manager determines an amount of leakage current power consumption based on measured temperature (block 604). The power manager adjusts the total power budget based on the amount of leakage current power consumption (block 606). The power manager assigns corresponding power consumption limits to the multiple partitions based on the adjusted total power budget and any received indications from the multiple partitions (block 608).

The power manager converts the assigned limits to assigned counts (block 610). The power manager sends the assigned counts to the multiple partitions (block 612). The power manager measures a duration of time (block 614). The power manager receives indications of activity levels of the multiple partitions (block 616). The power manager receives indications of any power reducing steps performed by the multiple partitions (block 618). In some implementations, the power manager is capable of updating the multiple assigned power limits (counts) for the partitions within a first time interval. The partitions are capable of determining whether to perform power reduction steps within a second time interval less than the first time interval. In an implementation, the first time interval is approximately a millisecond, and the second time interval is in the range of nanoseconds or microseconds. Therefore, the second time interval can be significantly less than the first time interval. Accordingly, when the partition exceeds the assigned power limit (count), the partition is able to recover and reduce its power consumption relatively quickly. If the power manager determines that the duration of time has not yet reached a particular time interval ("no" branch of the conditional block 620), then control flow of method 600 returns to block 614 where the power manager measures the duration of time. If the power manager determines that the duration of time has reached the particular time interval ("yes" branch of the conditional block 620), then control flow of method 600 returns to block 602 where the power manager again performs the steps in blocks 602 to 612 that updates the assigned power limits (counts) for the multiple partitions.

Figure 7:
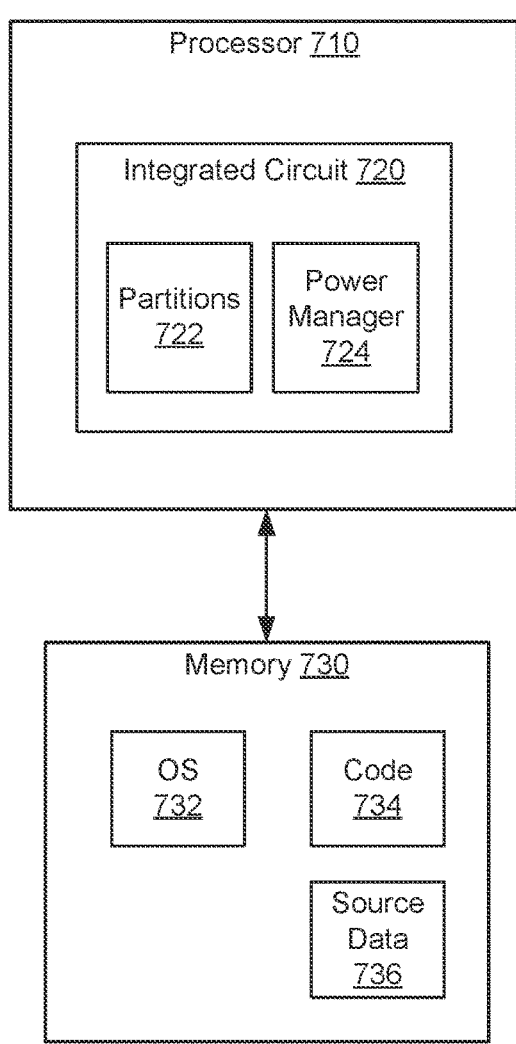
FIG. 7 is a generalized block diagram of a computing system.

Referring to FIG. 7, a generalized block diagram is shown of a computing system 700 with efficient management of power consumption of multiple partitions of an integrated circuit. The computing system 700 includes the processor 710 and the memory 730. Interfaces, such as a memory controller, a bus or a communication fabric, one or more phased locked loops (PLLs) and other clock generation circuitry, a power management unit, and so forth, are not shown for ease of illustration. It is understood that in other implementations, the computing system 700 includes one or more of other processors of a same type or a different type than processor 710, one or more peripheral devices, a network interface, one or more other memory devices, and so forth. In some implementations, the functionality of the computing system 700 is incorporated on a system on chip (SoC). In other implementations, the functionality of the computing system 700 is incorporated on a peripheral card inserted in a motherboard. The computing system 700 is used in any of a variety of computing devices such as a desktop computer, a tablet computer, a laptop, a smartphone, a smartwatch, a gaming console, a personal assistant device, and so forth.

The processor 710 includes hardware such as circuitry. For example, the processor 710 includes the integrated circuit 720 with multiple partitions 722 and a power manager 724. In various implementations, the partitions 722 have the functionality of partitions described earlier for the chip 110 (of FIG. 1) and the power manager 724 has the functionality of the power manager 180 (of FIG. 1) and the power manager 200 (of FIG. 2). In various implementations, the processor 710 includes one or more processing units. In some implementations, each of the processing units includes one or more processor cores capable of general-purpose data processing, and an associated cache memory subsystem. In such an implementation, the processor 710 is a central processing unit (CPU). In another implementation, the processing cores are compute units, each with a highly parallel data microarchitecture with multiple parallel execution lanes and an associated data storage buffer. In such an implementation, the processor 710 is a graphics processing unit (GPU), a digital signal processor (DSP), or other.

In some implementations, the memory 730 is system memory and includes one of a variety of types of dynamic random access memories (DRAMs). In other implementations, the memory 730 is main memory and includes one or more of a hard disk drive, a solid-state disk, other types of flash memory, a portable solid-state drive, a tape drive and so on. The memory 730 stores an operating system (OS) 732, one or more applications represented by code 734, and at least source data 736. Memory 730 is also capable of storing intermediate result data and final result data generated by the processor 710 when executing a particular application of code 734. Although a single operating system 732 and a single instance of code 734 and source data 736 are shown, in other implementations, another number of these software components are stored in memory 730. The operating system 732 includes instructions for initiating the boot up of the processor 710, assigning tasks to hardware circuitry, managing resources of the computing system 700 and hosting one or more virtual environments.

Each of the processor 710 and the memory 730 includes an interface unit for communicating with one another as well as any other hardware components included in the computing system 700. The interface units include queues for servicing memory requests and memory responses, and control circuitry for communicating with one another based on particular communication protocols. The communication protocols determine a variety of parameters such as supply voltage levels, power-performance states that determine an operating supply voltage and an operating clock frequency, a data rate, one or more burst modes, and so on.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
a power manager comprising circuitry configured to send a corresponding assigned power limit to each of a plurality of partitions;
wherein subsequent to a partition of the plurality of partitions receiving a first power limit from the power manager, circuitry of the partition is configured to:
reduce power consumption responsive to a measurement of power consumption calculated by the partition exceeding the first power limit; and
report, to the power manager, data that corresponds to a period of time during which the partition reduced the power consumption; and wherein the power manager is configured to send updated power limits to one or more of the plurality of partitions, the updated power limits being based at least in part on the data.

2. The apparatus as recited in claim 1, wherein the data comprises one or more of:

an amount of time the partition spent reducing the power consumption, an activity level, one or more calculated values or averages of the power consumption measurement, or steps taken to reduce the power consumption.

3. The apparatus as recited in claim 2 1, wherein:

the partition is further configured to send, to the power manager, the measurement of power consumption as a weighted sum of sampled signals within the partition; and the power manager is further configured to convert a corresponding assigned power limit represented in units of watts to a value that can be compared to the weighted sum.

4. The apparatus as recited in claim 1, wherein to reduce power consumption, the partition is further configured to insert stalls in an instruction execution pipeline.

5. The apparatus as recited in claim 1, wherein the partition is configured to reduce power consumption responsive to the measurement of power consumption, prior to receiving a new power limit from the power manager.

6. The apparatus as recited in claim 1, wherein the partition is further configured to report, to the power manager, each of a plurality of steps taken to reduce power consumption.

7. The apparatus as recited in claim 1, wherein the power manager is further configured to generate the updated power limit based at least in part on the one or more of steps to reduce power consumption and an amount of time spent performing the one or more steps to reduce power consumption.

8. A method, comprising:

sending, by a power manager comprising circuitry, a corresponding assigned power limit to each of a plurality of partitions that comprise circuitry;

reducing, by a partition of the plurality of partitions subsequent to the partition receiving a first power limit from the power manager, power consumption responsive to a measurement of power consumption calculated by the partition exceeding the first power limit;

reporting, to the power manager, data that corresponds to a period of time during which the partition reduced the power consumption; and sending, by the power manager, updated power limits to one or more of the plurality of partitions, the updated power limits being based at least in part on the data.

9. The method as recited in claim 8, wherein the data comprises one or more of:

an amount of time the partition spent reducing the power consumption, an activity level, one or more calculated values or averages of the power consumption measurement, or steps taken to reduce the power consumption.

10. The method as recited in claim 9, further comprising:

sending, by the partition to the power manager, the measurement of power consumption as a weighted sum of sampled signals within the partition; and converting, by the power manager, a corresponding assigned power limit represented in units of watts to a value that can be compared to the weighted sum.

11. The method as recited in claim 8, wherein to reduce power consumption, the method further comprises inserting stalls, by the partition, in an instruction execution pipeline.

12. The method as recited in claim 8, further comprising reducing power consumption responsive to the measurement of power consumption, prior to receiving a new power limit from the power manager.

13. The method as recited in claim 8, further comprising reporting, by the partition to the power manager, each of a plurality of steps taken to reduce power consumption.

14. The method as recited in claim 8, further comprising generating, by the power manager, the updated power limit based at least in part on one or more of steps to reduce power consumption and an amount of time spent performing the one or more steps to reduce power consumption.

15. A computing system comprising:

a processing unit comprising:

a plurality of partitions, each configured to process one or more applications of a workload;

a power manager configured to send a corresponding assigned power limit to each of the plurality of partitions; and wherein subsequent to a partition of the plurality of partitions receiving a first power limit from the power manager, the partition is configured to:

calculate a measurement of power consumption; and perform steps to reduce power consumption responsive to the measurement of power consumption calculated by the partition exceeding the first power limit; and report, to the power manager, data that corresponds to a period of time during which the partition reduced the power consumption; and wherein the power manager is configured to send updated power limits to one or more of the plurality of partitions, the updated power limits being based at least in part on the data.

16. The computing system as recited in claim 15, wherein the data comprises one or more of:

an amount of time the partition spent reducing the power consumption, an activity level, one or more calculated values or averages of the power consumption measurement, or steps taken to reduce the power consumption.

17. The computing system as recited in claim 16, wherein:

the partition is further configured to send, to the power manager, the measurement of power consumption as a weighted sum of sampled signals within the partition; and the power manager is further configured to convert a corresponding assigned power limit represented in units of watts to a value that can be compared to the weighted sum.

18. The computing system as recited in claim 15, wherein the partition is configured to perform steps to reduce power consumption responsive to the measurement of power consumption, prior to receiving a new power limit from the power manager.

19. The computing system as recited in claim 15, wherein to perform steps to reduce power consumption, the partition is further configured to divide an operating clock frequency.

20. The computing system as recited in claim 15, wherein the partition is further configured to report, to the power manager, each of a plurality of steps taken to reduce power consumption.

* * * * *